(12) United States Patent
Kremer et al.

(10) Patent No.: US 10,914,822 B2
(45) Date of Patent: Feb. 9, 2021

(54) DUAL-LASER CHIP-SCALE LIDAR FOR SIMULTANEOUS RANGE-DOPPLER SENSING

(71) Applicant: GM Global Technology Operations LLC, Detroit, MI (US)

(72) Inventors: Richard Kremer, Calabasas, CA (US); Keyvan Sayyah, Santa Monica, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 421 days.

(21) Appl. No.: 16/018,716

(22) Filed: Jun. 26, 2018

(65) Prior Publication Data

US 2019/0018110 A1    Jan. 17, 2019

Related U.S. Application Data

(60) Provisional application No. 62/531,414, filed on Jul. 12, 2017.

(51) Int. Cl.
*G01S 7/48* (2006.01)
*G01S 7/481* (2006.01)
(Continued)

(52) U.S. Cl.
CPC ............ *G01S 7/4815* (2013.01); *B81B 7/02* (2013.01); *G01S 7/4816* (2013.01); *G01S 7/4817* (2013.01); *G01S 7/4818* (2013.01); *G01S 7/491* (2013.01); *G01S 7/499* (2013.01); *G01S 7/4911* (2013.01); *G01S 7/4913* (2013.01);
(Continued)

(58) Field of Classification Search
USPC ........................................................ 356/5.01
See application file for complete search history.

(56) References Cited

U.S. PATENT DOCUMENTS 4,394,060 A * 7/1983 Verber ............... G02B 6/12004
324/76.36
5,139,879 A   8/1992 Aharoni
(Continued)

OTHER PUBLICATIONS

Hobbs, Philip C. D. "Ultrasensitive laser measurements without tears", Applied Optics, vol. 36, No. 4, Feb. 1, 1997, pp. 903-920.
(Continued)

*Primary Examiner* — James R Hulka
(74) *Attorney, Agent, or Firm* — Cantor Colburn LLP

(57) ABSTRACT

A chip-scale lidar system includes a first light source to output a first signal, and a second light source to output a second signal. A transmit beam coupler provides an output signal for transmission that includes a portion of the first signal and a portion of the second signal, and receive beam coupler obtains a received signal resulting from reflection of the output signal by a target. The system includes a first and second set of photodetectors to obtain a first and second set of electrical currents from a first and second set of combined signals including a first and second portion of the received signal. A processor obtains Doppler information about the target from the second set of electrical currents and obtains range information about the target from the first set of electrical currents and the second set of electrical currents.

20 Claims, 3 Drawing Sheets

(51) Int. Cl.

| | |
|---|---|
| *G01S 7/4911* | (2020.01) |
| *G01S 17/58* | (2006.01) |
| *G01S 17/42* | (2006.01) |
| *G01S 17/34* | (2020.01) |
| *G01S 17/86* | (2020.01) |
| *G01S 17/931* | (2020.01) |
| *G01S 7/499* | (2006.01) |
| *G01S 17/02* | (2020.01) |
| *G02B 6/122* | (2006.01) |
| *G02B 6/27* | (2006.01) |
| *G02B 6/42* | (2006.01) |
| *H01L 23/544* | (2006.01) |
| *H01L 31/0232* | (2014.01) |
| *H01L 31/16* | (2006.01) |
| *G01S 17/00* | (2020.01) |
| *G01S 17/32* | (2020.01) |
| *G01S 7/4914* | (2020.01) |
| *G01S 7/491* | (2020.01) |
| *G01S 7/497* | (2006.01) |
| *B81B 7/02* | (2006.01) |
| *G02B 27/30* | (2006.01) |
| *H01S 5/125* | (2006.01) |
| *G01S 7/4913* | (2020.01) |
| *G02B 6/00* | (2006.01) |

(52) U.S. Cl.
CPC .......... *G01S 7/4914* (2013.01); *G01S 7/4972* (2013.01); *G01S 17/003* (2013.01); *G01S 17/02* (2013.01); *G01S 17/32* (2013.01); *G01S 17/34* (2020.01); *G01S 17/42* (2013.01); *G01S 17/58* (2013.01); *G01S 17/86* (2020.01); *G01S 17/931* (2020.01); *G02B 6/122* (2013.01); *G02B 6/2766* (2013.01); *G02B 6/4209* (2013.01); *G02B 27/30* (2013.01); *H01L 23/544* (2013.01); *H01L 31/02327* (2013.01); *H01L 31/16* (2013.01); *H01S 5/125* (2013.01); *B81B 2207/03* (2013.01); *G02B 2006/0098* (2013.01); *H01L 2223/54426* (2013.01); *H01L 2223/54486* (2013.01)

(56) References Cited

U.S. PATENT DOCUMENTS

| | | | |
|---|---|---|---|
| 5,283,846 A | 2/1994 | Toyonaka | |
| 5,499,132 A | 3/1996 | Tojo | |
| 5,835,199 A * | 11/1998 | Phillips | G01S 7/4802 356/5.03 |
| 5,852,492 A * | 12/1998 | Nimblett | G01S 7/51 356/5.04 |
| 6,122,110 A | 11/2000 | Park | |
| 6,229,947 B1 | 5/2001 | Vawter | |
| 6,480,331 B1 | 11/2002 | Cao | |
| 6,839,170 B2 * | 1/2005 | Li | G02B 6/2746 359/484.04 |
| 6,962,345 B2 | 11/2005 | Inciong | |
| 7,031,574 B2 * | 4/2006 | Huang | G02B 6/2746 385/21 |
| 7,081,996 B2 * | 7/2006 | Wills | G02B 6/272 359/484.03 |
| 7,108,810 B2 | 9/2006 | Nakamura | |
| 7,359,593 B2 | 4/2008 | Little | |
| 7,481,588 B2 | 1/2009 | Monte | |
| 7,596,315 B2 * | 9/2009 | Nakashima | H04J 14/0246 398/34 |
| 8,116,602 B2 | 2/2012 | Little et al. | |
| 8,121,450 B2 | 2/2012 | Webster | |
| 8,193,555 B2 * | 6/2012 | Lin | H01L 27/14621 257/99 |
| 8,878,095 B2 * | 11/2014 | Li | B23K 26/066 219/121.75 |
| 8,908,251 B2 * | 12/2014 | Sayyah | G01S 7/4817 359/254 |
| 9,122,037 B2 | 9/2015 | Shastri | |
| 9,310,471 B2 | 4/2016 | Sayyah et al. | |
| 9,335,480 B1 | 5/2016 | Celo | |
| 9,575,162 B2 | 2/2017 | Owechko | |
| 9,720,218 B2 * | 8/2017 | Cui | G02B 21/367 |
| 9,733,544 B2 * | 8/2017 | Sayyah | H01L 31/02161 |
| 9,735,885 B1 * | 8/2017 | Sayyah | H01Q 15/0086 |
| 9,804,264 B2 * | 10/2017 | Villeneuve | G01S 17/931 |
| 9,823,118 B2 * | 11/2017 | Doylend | G01S 7/4813 |
| 10,288,805 B2 * | 5/2019 | Luff | G02B 6/1228 |
| 10,324,261 B2 * | 6/2019 | Leijtens | G02B 6/264 |
| 10,564,263 B2 * | 2/2020 | Efimov | G02B 6/122 |
| 10,591,600 B2 * | 3/2020 | Villeneuve | G01S 17/02 |
| 10,615,568 B2 * | 4/2020 | Sayyah | G02B 1/11 |
| 2001/0030807 A1 | 10/2001 | Ikari | |
| 2002/0012167 A1 | 1/2002 | Wills | |
| 2003/0077437 A1 * | 4/2003 | Nakamura | B82Y 20/00 428/327 |
| 2003/0155720 A1 * | 8/2003 | Inciong | F16J 15/0825 277/592 |
| 2004/0070827 A1 | 4/2004 | Li | |
| 2005/0018967 A1 | 1/2005 | Huang | |
| 2005/0213979 A1 | 9/2005 | Nakashima | |
| 2006/0002443 A1 | 1/2006 | Farber | |
| 2006/0285797 A1 * | 12/2006 | Little | G02B 6/1228 385/43 |
| 2008/0118208 A1 * | 5/2008 | Monte | G02B 6/25 385/96 |
| 2009/0096545 A1 * | 4/2009 | O'Hara | H01P 7/08 332/129 |
| 2009/0162013 A1 * | 6/2009 | Webster | G02B 6/32 385/39 |
| 2009/0262766 A1 * | 10/2009 | Chen | H03C 7/027 372/26 |
| 2010/0200898 A1 | 8/2010 | Lin | |
| 2010/0266288 A1 * | 10/2010 | Little | G02B 6/1228 398/139 |
| 2010/0301971 A1 * | 12/2010 | Yonak | H01P 7/082 333/219.1 |
| 2012/0152918 A1 | 6/2012 | Li | |
| 2013/0209033 A1 | 8/2013 | Luff | |
| 2014/0080729 A1 * | 3/2014 | Grego | G01N 33/54373 506/9 |
| 2014/0211298 A1 * | 7/2014 | Sayyah | G02F 1/29 359/298 |
| 2015/0023631 A1 * | 1/2015 | Shastri | G02B 6/46 385/14 |
| 2015/0042992 A1 | 2/2015 | Cui | |
| 2015/0062691 A1 * | 3/2015 | Sayyah | H01P 7/082 359/316 |
| 2015/0378011 A1 * | 12/2015 | Owechko | G01S 17/34 356/4.01 |
| 2015/0378012 A1 * | 12/2015 | Sayyah | G01S 17/34 356/4.01 |
| 2017/0153319 A1 | 6/2017 | Villeneuve | |
| 2017/0184450 A1 | 6/2017 | Doylend | |
| 2017/0336565 A1 | 11/2017 | Ryckman | |
| 2017/0370676 A1 | 12/2017 | Volfson | |
| 2018/0024299 A1 | 1/2018 | Leijtens | |
| 2019/0018112 A1 * | 1/2019 | Sayyah | G01S 7/499 |
| 2019/0018113 A1 * | 1/2019 | Sayyah | G01S 7/4816 |
| 2019/0018121 A1 * | 1/2019 | Sayyah | G01S 17/003 |

OTHER PUBLICATIONS

Schroedter et al., "Microcontroller based closed-loop control of a 2D quasi-static/resonant microscanner with on-chip piezo-resistive sensor feedback", Proc. of SPIE, vol. 10116, 2017, pp. 1-12.

(56) References Cited

OTHER PUBLICATIONS

Winter et al., "Micro-beamer based on MEMS micro-mirrors and laser light source", Procedia Chemistry, vol. 1, Issue 1, 2009, pp. 1311-1314.

* cited by examiner

DUAL-LASER CHIP-SCALE LIDAR FOR SIMULTANEOUS RANGE-DOPPLER SENSING

CROSS-REFERENCE TO RELATED APPLICATIONS

This application claims the benefit of priority of U.S. Provisional Application No. 62/531,414 filed Jul. 12, 2017, the disclosure of which is incorporated herein by reference in its entirety.

INTRODUCTION

The subject disclosure relates to dual-laser chip-scale lidar for simultaneous range-Doppler sensing.

Vehicles (e.g., automobiles, trucks, construction equipment, farm equipment, automated factory equipment) are increasingly outfitted with sensors that provide information to augment or automate vehicle operation. Exemplary sensors include radio detection and ranging (radar) systems, cameras, microphones, and light detection and ranging (lidar) systems. An exemplary lidar system is a coherent lidar system that transmits a frequency modulated continuous wave (FMCW) signal, also referred to as a chirp, and relies on optical coherence between the transmitted signal and a return signal resulting from reflected scattering of the transmitted signal by a target to perform detection of the target. When a radar or lidar signal is transmitted, the frequency shift in the return signal that is reflected by a target, as compared with the transmitted signal, is referred to as the Doppler effect. This Doppler shift facilitates the determination of relative speed and direction of travel of the target. In a typical coherent lidar system, a single light source is used to perform both range and Doppler sensing. Accordingly, it is desirable to provide dual-laser chip-scale lidar for simultaneous range-Doppler sensing.

SUMMARY

In one exemplary embodiment, a chip-scale lidar system includes a first light source to output a first signal, and a second light source to output a second signal. A transmit beam coupler provides an output signal for transmission, the output signal including a portion of the first signal and a portion of the second signal, and a receive beam coupler obtains a received signal resulting from reflection of the output signal by a target. The system also includes a first set of photodetectors to obtain a first set of electrical currents respectively from a first set of combined signals, each of the first set of combined signals including a first portion of the received signal, and a second set of photodetectors to obtain a second set of electrical currents respectively from a second set of combined signals, each of the second set of combined signals including a second portion of the received signals. A processor obtains Doppler information about the target from the second set of electrical currents and obtains range information about the target from the first set of electrical currents and the second set of electrical currents.

In addition to one or more of the features described herein, the first light source outputs a frequency modulated continuous wave (FMCW) signal as the first signal.

In addition to one or more of the features described herein, the second light source outputs a continuous wave (CW) signal as the second signal In addition to one or more of the features described herein, the second signal is at a frequency $f_D$ and the lidar system further comprises a modulator and optical filter to produce a shifted signal with a frequency of $f_m+f_D$.

In addition to one or more of the features described herein, the modulator is a Mach-Zehnder modulator.

In addition to one or more of the features described herein, the shifted signal is combined with the second portion of the received signal to produce the second set of combined signals.

In addition to one or more of the features described herein, the second signal is at two distinct optical frequencies $f_{D1}$ and $f_{D2}$, and the second set of electrical currents indicates a frequency shift $f_{D2}-f_{D1}$ to determine a direction of the target relative to the lidar system.

In addition to one or more of the features described herein, the system also includes a transmit beam steering device to direct the output signal from the transmit beam coupler and a receive beam steering device to direct the received signal to the receive beam coupler.

In addition to one or more of the features described herein, the lidar system is in a vehicle.

In another exemplary embodiment, a method of fabricating a chip-scale lidar system includes forming a first light source to output a first signal, and forming a second light source to output a second signal. The method also includes disposing a transmit beam coupler to provide an output signal for transmission, the output signal including a portion of the first signal and a portion of the second signal, and disposing a receive beam coupler to obtain a received signal resulting from reflection of the output signal by a target. A first set of photodetectors is formed to obtain a first set of electrical currents respectively from a first set of combined signals, each of the first set of combined signals including a first portion of the received signal. A second set of photodetectors is formed to obtain a second set of electrical currents respectively from a second set of combined signals, each of the second set of combined signals including a second portion of the received signals. A processor obtains Doppler information about the target from the second set of electrical currents and to obtain range information about the target from the first set of electrical currents and the second set of electrical currents.

In addition to one or more of the features described herein, forming the first light source includes forming the first light source to output a frequency modulated continuous wave (FMCW) signal as the first signal.

In addition to one or more of the features described herein, forming the second light source includes forming the second light source to output a continuous wave (CW) signal as the second signal.

In addition to one or more of the features described herein, outputting the second signal is at a frequency $f_D$ and the method further comprises disposing a modulator and optical filter to produce a shifted signal with a frequency of $f_m+f_D$ and the method further comprises combing the shifted signal with the second portion of the received signal to produce the second set of combined signals.

In addition to one or more of the features described herein, outputting the second signal is at two distinct optical frequencies $F_{D1}$ and $f_{D2}$, and obtaining the second set of electrical currents indicates a frequency shift $f_{D2}-F_{D1}$ to determine a direction of the target relative to the lidar system.

In yet another exemplary embodiment, a vehicle includes a chip-scale lidar system that includes a first light source to output a first signal, and a second light source to output a second signal. The system also includes a transmit beam coupler to provide an output signal for transmission, the output signal including a portion of the first signal and a portion of the second signal, and a receive beam coupler to obtain a received signal resulting from reflection of the output signal by a target. A first set of photodetectors obtains a first set of electrical currents respectively from a first set of combined signals, each of the first set of combined signals including a first portion of the received signal, and a second set of photodetectors obtains a second set of electrical currents respectively from a second set of combined signals, each of the second set of combined signals including a second portion of the received signals. A processor obtains Doppler information about the target from the second set of electrical currents and obtains range information about the target from the first set of electrical currents and the second set of electrical currents. The vehicle also includes a vehicle controller to augment or automate vehicle operation based on information from the lidar system.

In addition to one or more of the features described herein, the first light source outputs a frequency modulated continuous wave (FMCW) signal as the first signal, and the second light source outputs a continuous wave (CW) signal as the second signal.

In addition to one or more of the features described herein, the second signal is at a frequency $f_D$, the lidar system further comprises a modulator and optical filter to produce a shifted signal with a frequency of $f_m+f_D$, and the shifted signal is combined with the second portion of the received signal to produce the second set of combined signals.

In addition to one or more of the features described herein, the modulator is a Mach-Zehnder modulator.

In addition to one or more of the features described herein, the second signal is at two distinct optical frequencies $f_{D1}$ and $f_{D2}$, and the second set of electrical currents indicates a frequency shift $f_{D2}-f_{D1}$ to determine a direction of the target relative to the lidar system.

In addition to one or more of the features described herein, the system includes a transmit beam steering device to direct the output signal from the transmit beam coupler and a receive beam steering device to direct the received signal to the receive beam coupler.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
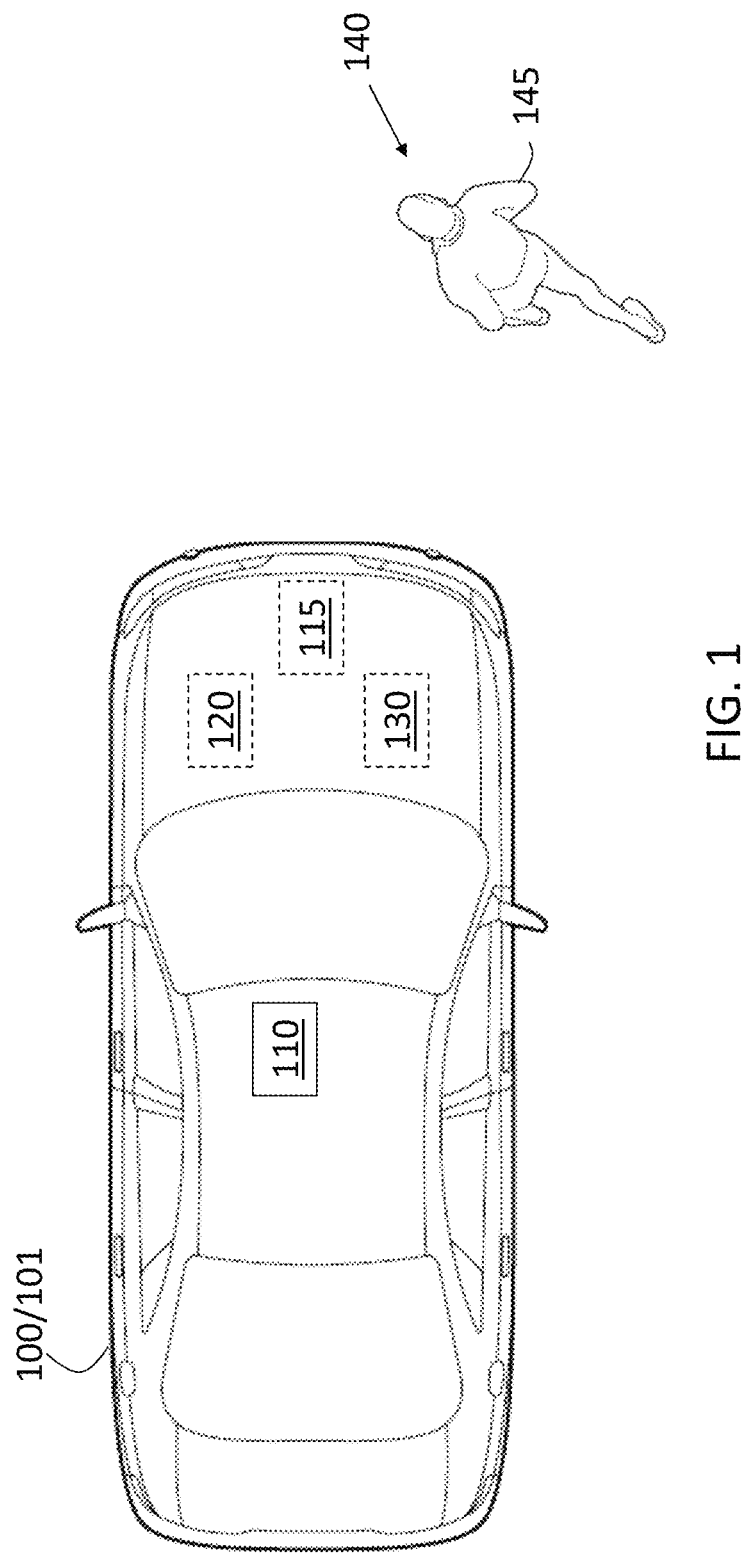
FIG. 1 is a block diagram of a scenario involving a dual-laser chip-scale coherent lidar system according to embodiments.

The following description is merely exemplary in nature and is not intended to limit the present disclosure, its application or uses. It should be understood that throughout the drawings, corresponding reference numerals indicate like or corresponding parts and features.

As previously noted, conventional lidar systems use a single light source to perform both range and Doppler sensing. Embodiments of the systems and methods detailed herein relate to dual-laser chip-scale lidar for simultaneous range-Doppler sensing. Dual-laser refers to the fact that two different light sources are used. As compared with the conventional lidar system that uses a single light source, signal-to-noise ratio (SNR) may be improved on the order of 3 decibels (dB). In the dual-laser embodiments, one light source provides an FMCW signal and another light source provides a continuous wave (CW) signal without frequency modulation. The FMCW signal may be in the form of a triangle wave with a portion, referred to as an up-chirp, which exhibits a linear increase in frequency versus time and a portion, referred to as a down-chirp, which exhibits a linear decrease in frequency versus time. The unmodulated CW signal is used in the Doppler velocity sensing and the FMCW signal is used for obtaining the target range given the Doppler velocity information obtained from the unmodulated CW signal. Two exemplary embodiments of dual-laser chip-scale lidar systems are detailed.

Figure 2:
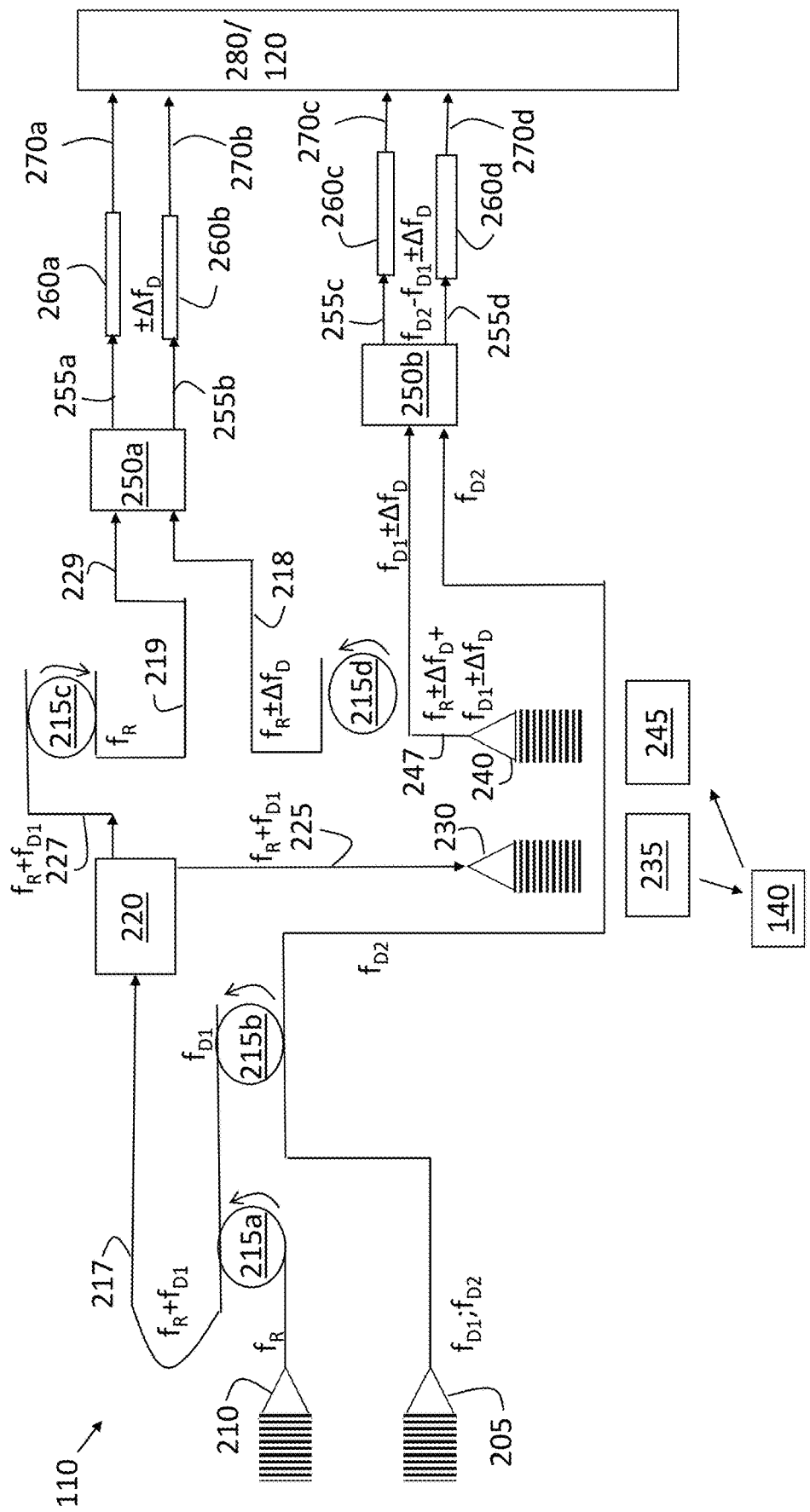
FIG. 2 is a block diagram of the lidar system according to one or more embodiments.
Figure 3:
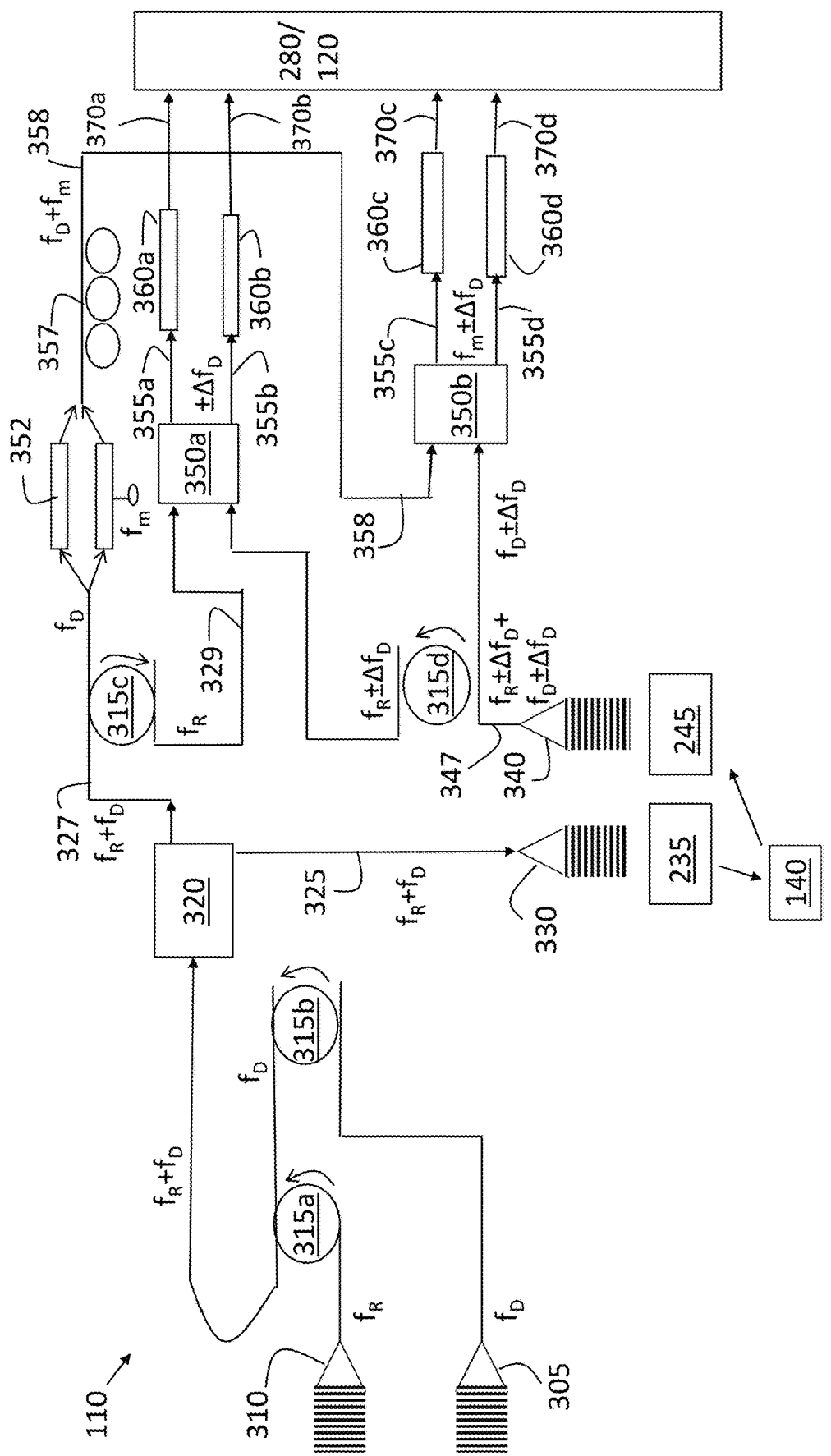
FIG. 3 is a block diagram of the lidar system according to one or more alternate embodiments.

In accordance with an exemplary embodiment, FIG. 1 is a block diagram of a scenario involving a dual-laser chip-scale coherent lidar system 110. The vehicle 100 shown in FIG. 1 is an automobile 101. A lidar system 110, further detailed with reference to FIGS. 2 and 3, is shown on the roof of the automobile 101. According to alternate or additional embodiments, one or more lidar systems 110 may be located elsewhere on the vehicle 100 (e.g., front and back bumpers, sides). Another sensor 115 (e.g., camera, sonar, radar system) is shown, as well. Information obtained by the lidar system 110 and one or more other sensors 115 may be provided to a controller 120 (e.g., electronic control unit (ECU)) for image or data processing, target recognition, and subsequent vehicle control.

The controller 120 may use the information to control one or more vehicle systems 130. In an exemplary embodiment, the vehicle 100 may be an autonomous vehicle and the controller 120 may perform known vehicle operational control using information from the lidar system 110 and other sources. In alternate embodiments, the controller 120 may augment vehicle operation using information from the lidar system 110 and other sources as part of a known system (e.g., collision avoidance system, adaptive cruise control system). The lidar system 110 and one or more other sensors 115 may be used to detect objects 140, such as the pedestrian 145 shown in FIG. 1. The controller 120 may include processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

FIG. 2 is a block diagram of the lidar system 110 according to one or more embodiments. Some or all of the components shown in FIG. 2 may be part of a photonic chip. As such, the lidar system 110 may be referred to as a chip-scale lidar. Two light sources 205, 210 are used in the dual-laser lidar system 110. The light sources 205, 210 may be laser diodes formed on the photonic chip. The light source 205 outputs CW signals at frequencies $f_{D1}$ and $f_{D2}$. The light source 210 outputs FMCW signals at a center frequency $f_R$. As previously noted, the FMCW signal may include an up-chirp and a down-chirp, and the difference $\Delta f$ is the frequency difference between the highest and lowest frequencies in each chirp. The light source 210 may include a controllable current source that is modulated to modulate the output of a laser diode and thereby generate the FMCW light. The resonators 215a, 215b, 215c, 215d (generally referred to as 215) shown in FIG. 2 function as add, drop, or through ports. The resonator 215a acts as a drop port that drops (i.e., couples up) frequency $f_R$ onto the bus waveguide 217. The resonator 215b functions as a drop port for frequency $F_{D1}$ and a through port for frequency $f_{D2}$. Thus, the CW signal at frequency $F_{D1}$ is coupled up to combine with the FMCW signal at frequency $f_R$, in waveguide 217 as shown, while the CW signal at frequency $f_{D2}$ is separated and provided to the combiner 250b, which is further discussed.

At the splitter 220, a combination of the FMCW signal at frequency $f_R$ and the CW signal at frequency $f_{D1}$ is split. According to an exemplary embodiment, most of the signal (e.g., 90 percent) is directed to the transmit beam coupler 230 (e.g., grating coupler, edge coupler) as the output signal 225 while another portion is split as signal 227. A transmit beam scanner 235 (e.g., two-dimensional (2D) microelectromechanical system (MEMS) scanner) directs the output signal 225 out of the lidar system 110. When the output signal 225 encounters a target 140, some of the resulting scattered light is directed, by a receive beam scanner 245, into a receive beam coupler 240 (e.g., grating coupler, edge coupler) as a received signal 247. Based on the Doppler frequency shift in the received signal 247 due to the relative velocity between the lidar and the target, the FMCW component is shifted from $f_R$ by $\Delta f_D$ and the CW component is shifted from $f_{D1}$ by $\Delta f_D$.

The resonator 215d is used to drop (i.e., couple up) only the shifted FMCW component of the received signal 247 with frequency $f_R \pm \Delta f_D$ onto the waveguide 218. The CW component of the received signal 247, with frequency $f_{D1} \pm \Delta f_D$, is provided to the combiner 250b along with the CW signal at frequency $f_{D2}$, which is the CW LO signal from the light source 205. The combiner 250b combines the CW component of the received signal 247, with frequency $f_{D1} \pm \Delta f_D$, and the CW LO signal from the light source 205 at frequency $f_{D2}$ and splits the combination into combined signals 255c, 255d (combined signals 255a, 255b, 255c, 255d generally referred to as 255). The combined signals 255c, 255d are respectively provided to two photodetectors 260c, 260d (photodetectors 260a, 260b, 260c, 260d are generally referred to as 260). The photodetectors 260 may be germanium-on-silicon photodetectors, for example. The components of each combined signal 255c, 255d interfere with each other in each photodetector 260c, 260d.

The photodetectors 260c, 260d convert the result of the interference into electrical currents 270c, 270d that are also referred to as beat signals. The electrical currents 270c, 270d from each of the photodetectors 260c, 260d are combined and processed to obtain Doppler velocity information about the target 140. The received Doppler frequency $\Delta f_D$ in the photodetectors 260c and 260d are shifted by the difference in the two optical frequencies of laser 205, $f_{D2} - f_{D1}$ in order to enable the determination of the direction of the Doppler velocity of the target relative to the lidar. The processing may be performed within the lidar system 110 by a processor 280 or outside the lidar system 110 by the controller 120, for example. The processor 280 may include processing circuitry similar to that discussed for the controller 120.

The portion of the received signal 247 that is dropped (i.e., coupled up) by the resonator 215d to waveguide 218, the shifted FMCW component of the received signal 245 with frequency $f_R \pm \Delta f_D$, is input to combiner 250a. The signal 227 from the splitter 220 is provided to resonator 215c. Only the FMCW component at frequency $f_R$ is dropped (i.e., coupled up) by the resonator 215c as local oscillator (LO) signal 229 onto waveguide 219 and is also provided to the combiner 250a. The combiner 250a combines the LO signal 229 and the FMCW signal from the resonator 215d, which is at frequency $f_R \pm \Delta f_D$. The combiner 250a splits the combined signal into combined signals 255a, 255b which are provided, respectively, to photodetectors 260a, 260b.

The results of interference among the combined signals 255a, 255b at each of the photodetectors 260a, 260b are converted into electrical signals 270a, 270b, referred to as beat signals. The frequency $f_b^+$ is the frequency of the beat signals during the up-chirp, and the frequency $f_b^-$ is the frequency of the beat signals during the down-chirp. The photodetectors 260a, 260b are used in accordance with a known balanced detector technique to cancel intensity noise in the LO signal 229 that is common to both photodetectors 260a, 260b.

The electrical signals 270a, 270b and the electrical signals 270c, 270d are used to determine range to the target 140. The determination of range is made for each up-chirp and each down-chirp in the FMCW signal output by the light source 210. The range determination for the up-chirp portion is given by:

$$R = \frac{c(f_b^+ + \Delta f_D)T}{2\Delta f} \qquad [\text{EQ. 1}]$$

In EQ. 1, T is the period of the chirp, and c is the speed of light. The range determination for the down-chirp portion is given by:

$$R = \frac{c(f_b^- - \Delta f_D)T}{2\Delta f} \qquad [\text{EQ. 2}]$$

FIG. 3 is a block diagram of the lidar system 110 according to one or more alternate embodiments. Like the embodiment shown in FIG. 2, the embodiment shown in FIG. 3 includes two light sources 305, 310. The light sources 305, 310, like the light sources 205, 210, may be laser diodes formed on the photonic chip. The light source 310 provides FMCW signal at frequency $f_R$ like the light source 210 in FIG. 2, but the light source 305 provides a CW signal at only one frequency, $f_D$, unlike the light source 205 in FIG. 2. Based on the resonators 315a, 315b, a signal with an FMCW component at $f_R$ and a CW component at $f_D$ is provided to the splitter 320. The splitter 320 provides an output signal 325 to the transmit beam coupler 230 for transmission by the transmit beam scanner 235. As noted with reference to FIG. 2, the majority (e.g., 90 percent) of the signal that includes the FMCW component at frequency $f_R$ and the CW component at frequency $f_D$ may be split as the output signal 325. The remaining portion of the split is provided as signal 327.

The signal 327 is provided to resonator 315c, which only drops (i.e., couples up) the FMCW portion of the signal at frequency $f_R$ as the LO signal 329 and provides it to the combiner 350a. *The CW portion of the signal 327 at frequency $f_D$ is provided to a modulator 352 (e.g., a Mach-Zehnder modulator (MZM)) to induce a frequency shift by frequency $f_m$. The frequency $f_m$ may be, for example, in the range of 100 megaHertz (MHz) to 1 gigaHertz (GHz). This is followed by a narrowband optical filter 357 such that the shifted signal 358 has a frequency $f_D + f_m$.*

When the output signal 325 encounters a target 140, some of the resulting scattered light is directed, by a receive beam scanner 245, into a receive beam coupler 340 as a received signal 347. Based on the Doppler frequency shift in the received signal 347, the FMCW component is shifted from $f_R$ by $\Delta f_D$ and the CW component is shifted from $f_D$ by $\Delta f_D$. The resonator 315d is used to coupled up only the shifted FMCW component of the received signal 347 with frequency $f_R \pm \Delta f_D$. The CW component of the received signal 347, with frequency $f_D + \Delta f_D$, is provided to the combiner 350b along with the shifted signal 358 at frequency $f_D + f_m$. The combiner 350b splits its output as combined signals 355c, 355d, which are respectively provided to photodetectors 360c, 360d (generally, photodetectors 360a, 360b, 360c, 360d are referred to as 360). The photodetectors 360 may be germanium-on-silicon photodetectors, for example. As noted with reference to FIG. 2, the photodetectors 360c, 360d convert the result of the interference of each of the combined signals 355c, 355d into respective electrical currents 370c, 370d, *which are also referred to as beat signals.*

At combiner 350a, along with LO signal 329, the portion of the received signal 347 that is coupled up by the resonator 315d is also input. The combination of the two signals is split into combined signals 355a, 355b, which are respectively provided to photodetectors 360a, 360b. The electrical currents 370a, 370b obtained respectively from the photodetectors 360a, 360b are provided for processing along with electrical currents 370c, 370d. The processing may be done by processor 280 of the lidar system 110 or by the controller 120.

As discussed with reference to FIG. 2, one set of electrical currents 370c, 370d is used to perform Doppler velocity sensing. All four electrical currents 370a, 370b, 370c, 370d are involved in the determination of range to the target 140, and the determination of range is performed for each up-chirp and each down-chirp of the FMCW signal output by the light source 310. From the electrical currents 370a, 370b provided by the photodetectors 360a, 360b, the frequency $f_b^+$ is the frequency of the beat signals during the up-chirp, and the frequency $f_b^-$ is the frequency of the beat signals during the down-chirp. The range determination is detailed in EQS. 1 and 2. The frequency shift $f_m$ facilitates the determination of the direction of the Doppler velocity of the target relative to the lidar.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A chip-scale lidar system, comprising:
  a first light source configured to output a first signal;
  a second light source configured to output a second signal;
  a transmit beam coupler configured to provide an output signal for transmission, the output signal including a portion of the first signal and a portion of the second signal;
  a receive beam coupler configured to obtain a received signal resulting from reflection of the output signal by a target;
  a first set of photodetectors configured to obtain a first set of electrical currents respectively from a first set of combined signals, each of the first set of combined signals including a first portion of the received signal;
  a second set of photodetectors configured to obtain a second set of electrical currents respectively from a second set of combined signals, each of the second set of combined signals including a second portion of the received signals; and
  a processor configured to obtain Doppler information about the target from the second set of electrical currents and to obtain range information about the target from the first set of electrical currents and the second set of electrical currents.

2. The lidar system according to claim 1, wherein the first light source is configured to output a frequency modulated continuous wave (FMCW) signal as the first signal.

3. The lidar system according to claim 1, wherein the second light source is configured to output a continuous wave (CW) signal as the second signal.

4. The lidar system according to claim 3, wherein the second signal is at a frequency $f_D$ and the lidar system further comprises a modulator and optical filter to produce a shifted signal with a frequency of $f_m + f_D$.

5. The lidar system according to claim 4, wherein the modulator is a Mach-Zehnder modulator.

6. The lidar system according to claim 4, wherein the shifted signal is combined with the second portion of the received signal to produce the second set of combined signals.

7. The lidar system according to claim 3, wherein the second signal is at two distinct optical frequencies $F_{D1}$ and $f_{D2}$, and the second set of electrical currents indicates a frequency shift $f_{D2} - f_{D1}$ to determine a direction of the target relative to the lidar system.

8. The lidar system according to claim 1, further comprising a transmit beam steering device configured to direct the output signal from the transmit beam coupler and a receive beam steering device configured to direct the received signal to the receive beam coupler.

9. The lidar system according to claim 1, wherein the lidar system is in a vehicle.

10. A method of fabricating a chip-scale lidar system, the method comprising:
  forming a first light source to output a first signal;
  forming a second light source to output a second signal;
  disposing a transmit beam coupler to provide an output signal for transmission, the output signal including a portion of the first signal and a portion of the second signal;
  disposing a receive beam coupler to obtain a received signal resulting from reflection of the output signal by a target;
  forming a first set of photodetectors to obtain a first set of electrical currents respectively from a first set of combined signals, each of the first set of combined signals including a first portion of the received signal;
  forming a second set of photodetectors to obtain a second set of electrical currents respectively from a second set of combined signals, each of the second set of combined signals including a second portion of the received signals; and
  configuring a processor to obtain Doppler information about the target from the second set of electrical currents and to obtain range information about the target from the first set of electrical currents and the second set of electrical currents.

11. The method according to claim 10, wherein forming the first light source includes forming the first light source to output a frequency modulated continuous wave (FMCW) signal as the first signal.

12. The method according to claim 10, wherein forming the second light source includes forming the second light source to output a continuous wave (CW) signal as the second signal.

13. The method according to claim 12, wherein outputting the second signal is at a frequency $f_D$ and the method further comprises disposing a modulator and optical filter to produce a shifted signal with a frequency of $f_m+f_D$ and the method further comprises combing the shifted signal with the second portion of the received signal to produce the second set of combined signals.

14. The method according to claim 12, wherein outputting the second signal is at two distinct optical frequencies $F_{D1}$ and $f_{D2}$, and obtaining the second set of electrical currents indicates a frequency shift $f_{D2}-F_{D1}$ to determine a direction of the target relative to the lidar system.

15. A vehicle, comprising:
a chip-scale lidar system comprising:
a first light source configured to output a first signal;
a second light source configured to output a second signal;
a transmit beam coupler configured to provide an output signal for transmission, the output signal including a portion of the first signal and a portion of the second signal;
a receive beam coupler configured to obtain a received signal resulting from reflection of the output signal by a target;
a first set of photodetectors configured to obtain a first set of electrical currents respectively from a first set of combined signals, each of the first set of combined signals including a first portion of the received signal;
a second set of photodetectors configured to obtain a second set of electrical currents respectively from a second set of combined signals, each of the second set of combined signals including a second portion of the received signals; and
a processor configured to obtain Doppler information about the target from the second set of electrical currents and to obtain range information about the target from the first set of electrical currents and the second set of electrical currents; and
a vehicle controller configured to augment or automate vehicle operation based on information from the lidar system.

16. The vehicle according to claim 15, wherein the first light source is configured to output a frequency modulated continuous wave (FMCW) signal as the first signal, and the second light source is configured to output a continuous wave (CW) signal as the second signal.

17. The vehicle according to claim 16, wherein the second signal is at a frequency $f_D$, the lidar system further comprises a modulator and optical filter to produce a shifted signal with a frequency of $f_m+f_D$, and the shifted signal is combined with the second portion of the received signal to produce the second set of combined signals.

18. The vehicle according to claim 17, wherein the modulator is a Mach-Zehnder modulator.

19. The vehicle according to claim 15, wherein the second signal is at two distinct optical frequencies $f_{D1}$ and $f_{D2}$, and the second set of electrical currents indicates a frequency shift $f_{D2}-f_{D1}$ to determine a direction of the target relative to the lidar system.

20. The vehicle according to claim 15, further comprising a transmit beam steering device configured to direct the output signal from the transmit beam coupler and a receive beam steering device configured to direct the received signal to the receive beam coupler.

* * * * *